United States Patent
Bae et al.

(10) Patent No.: US 9,343,702 B2
(45) Date of Patent: May 17, 2016

(54) ADHESIVE FILM AND METHOD FOR ENCAPSULATING ORGANIC ELECTRONIC DEVICE USING SAME

(71) Applicant: LG Chem, Ltd., Seoul (KR)

(72) Inventors: Kyung Yul Bae, Daejeon (KR); Hyun Jee Yoo, Daejeon (KR); Seung Min Lee, Daejeon (KR); Yoon Gyung Cho, Daejeon (KR); Suk Ky Chang, Daejeon (KR); Jung Sup Shim, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 14/609,172

(22) Filed: Jan. 29, 2015

(65) Prior Publication Data

US 2015/0144932 A1 May 28, 2015

Related U.S. Application Data

(63) Continuation of application No. PCT/KR2013/007013, filed on Aug. 2, 2013.

(30) Foreign Application Priority Data

Aug. 2, 2012 (KR) .................. 10-2012-0084977
Aug. 2, 2013 (KR) .................. 10-2013-0092126

(51) Int. Cl.
*H01L 51/52* (2006.01)
*C09J 163/00* (2006.01)
(Continued)

(52) U.S. Cl.
CPC .......... *H01L 51/5253* (2013.01); *B32B 37/025* (2013.01); *C09J 7/00* (2013.01); *C09J 163/00* (2013.01); *B32B 37/12* (2013.01); *B32B 2310/0806* (2013.01); *B32B 2457/206* (2013.01);
(Continued)

(58) Field of Classification Search
CPC .............. H01L 51/5256; B32B 37/18; B32B 2457/206; B32B 2310/0806; C09J 2463/00
USPC ................... 257/729; 156/701; 428/41.9
See application file for complete search history.

(56) References Cited

U.S. PATENT DOCUMENTS 6,428,900 B1* 8/2002 Wang ............... C09J 167/00
428/481
6,867,539 B1* 3/2005 McCormick ...... H01L 51/5237
257/40

(Continued)

FOREIGN PATENT DOCUMENTS

JP 2003-177241 A 6/2003
JP 4699676 B2 6/2011

(Continued)

*Primary Examiner* — Caridad Everhart
(74) *Attorney, Agent, or Firm* — Dentons US LLP (57) ABSTRACT

The present invention relates to an adhesive film, to an encapsulated product of an organic electronic device using same and to a method for encapsulating an organic electronic device using same. More particularly, an adhesive film for encapsulating an organic electronic device comprises: a protective film layer, a first adhesive layer, a second adhesive layer and a release film layer sequentially arranged. The peel strength (A) between the first adhesive layer and the protective film layer is lower than the peel strength (B) between the second adhesive layer and the release film layer, and the peel strength (B) between the second adhesive layer and the release film layer is lower than the peel strength (C) between the first adhesive layer and an encapsulation substrate, thus improving faults during a peeling process.

15 Claims, 2 Drawing Sheets

(51) Int. Cl.
*C09J 7/00* (2006.01)
*B32B 37/00* (2006.01)
*B32B 37/12* (2006.01)

(52) U.S. Cl.
CPC ........ *C09J 2201/36* (2013.01); *C09J 2201/606* (2013.01); *C09J 2201/622* (2013.01); *C09J 2203/326* (2013.01); *C09J 2463/00* (2013.01); *Y10T 428/1471* (2015.01)

(56) References Cited

U.S. PATENT DOCUMENTS

| | | | |
|---|---|---|---|
| 8,742,411 B2 | 6/2014 | Yoo et al. | |
| 8,808,821 B2 | 8/2014 | Takeda et al. | |
| 2006/0088698 A1* | 4/2006 | Majumdar | H01B 1/122 428/195.1 |
| 2009/0081389 A1* | 3/2009 | Ishida | B41M 7/0027 428/29 |
| 2009/0163603 A1* | 6/2009 | Wempe | A61K 8/85 514/772.4 |
| 2010/0068514 A1* | 3/2010 | Ellinger | C09J 153/02 428/351 |
| 2012/0034460 A1* | 2/2012 | Tamada | B32B 15/20 428/355 N |
| 2012/0113361 A1* | 5/2012 | Huang | G06F 3/041 349/96 |

FOREIGN PATENT DOCUMENTS

| | | |
|---|---|---|
| KR | 10-2008-0088606 A | 10/2008 |
| KR | 10-2010-0116712 A | 11/2010 |
| WO | 2012-060621 A2 | 5/2012 |

* cited by examiner

<ROOM TEMPERATURE>

FIG. 3

<heat lamination process>

FIG. 4

ADHESIVE FILM AND METHOD FOR ENCAPSULATING ORGANIC ELECTRONIC DEVICE USING SAME

This application is a Bypass Continuation of National Stage International Application No. PCT/KR2013/007013, filed on Aug. 2, 2013, which claims priority to and the benefit of Korean Patent Application Nos. 10-2012-0084977, filed on Aug. 2, 2012 and 10-2013-0092126, filed on Aug. 2, 2013, both of which are incorporated herein by reference in their entirety.

TECHNICAL FIELD

The present invention relates to an adhesive film and a method of encapsulating an organic electronic device using the same.

BACKGROUND ART

An organic electronic device (OED) refers to an device including an organic material layer generating a charge flow using holes and electrons, for example, a photovoltaic device, a rectifier, a transmitter, or an organic light emitting diode (OLED).

Among the organic electronic devices, OLEDs have less power consumption and a higher response speed than other light sources, and has advantages in fabricating a thin display device or illuminating device. In addition, since OLEDs have excellent space utilization, OLEDs are expected to be applied to various fields, such as various portable devices, monitors, laptops, and TVs.

The most significant problem in commercialization and pervasive use of OLEDs is durability. Organic materials and metal electrodes included in an OLED may be very easily oxidized by an external factor such as moisture. Accordingly, a product including an OLED may be very sensitive to environmental conditions. Thus, various methods of effectively blocking penetration of oxygen or moisture into an organic electronic device such as an OLED have been proposed. One of those methods is to use an adhesive film.

However, since an existing adhesive film for encapsulating an OLED is formed in a single layer disposed between two release films, adhesion and release properties are very poor. In particular, as the size of the adhesive film increases due to a growth in size of an OLED, a failure rate in peeling of the adhesive film during a process of encapsulating the OLED increases. For example, a peeling failure, such as lifting of the adhesive film, may occur when a protection film or a release film is peeled.

Although release films having different peeling properties have been used, it is not enough to solve the problem.

Accordingly, an adhesive film capable of effectively blocking penetration of moisture, reducing damage to an organic electronic device, and at the same time, reducing defects generated during the process of encapsulating the OLED, needs to be developed.

DISCLOSURE

Technical Problem

The present invention is directed to an adhesive film, an organic electronic device encapsulation product using the same, and a method of encapsulating an organic electronic device.

Technical Solution

According to an aspect of the present invention, there is provided an adhesive film for encapsulating an organic electronic element including a protection film, a first adhesive layer formed on the protection film, a second adhesive layer formed on the first adhesive layer, and a release film formed on the second adhesive layer. The first and second adhesive layers satisfy the following General Equation 1, $$C > B > A \qquad \text{[General Equation 1]}$$

wherein A represents a peeling strength between the first adhesive layer and the protection film, B represents a peeling strength between the second adhesive layer and the release film, and C represents a peeling strength between the first adhesive layer and an encapsulation substrate after the protection film is removed.

According to another aspect of the present invention, there is provided an organic electronic device encapsulation product including a substrate, an organic electronic device formed on the substrate, and an adhesive film encapsulating the organic electronic device. The adhesive film includes a first adhesive layer and a second adhesive layer.

Advantageous Effects

When an organic electronic device is encapsulated using an adhesive film according to the exemplary embodiments of the present invention, failures, such as lifting or chipping, occurring in a process of peeling a protection film and/or a release film can be suppressed, and process defects can be prevented.

DESCRIPTION OF REFERENCE NUMERALS

1: protection film layer
2: curable adhesive layer
2a: first adhesive layer
2b: second adhesive layer
3: release film layer
4: encapsulation substrate

MODES FOR CARRYING OUT THE INVENTION

Exemplary embodiments of the present invention will be described in detail below with reference to the accompanying drawings. While the present invention is shown and described in connection with exemplary embodiments thereof, it will be apparent to those skilled in the art that various modifications can be made without departing from the spirit and scope of the invention.

An adhesive film according to an exemplary embodiment of the present invention includes a multilayered adhesive layer encapsulating an organic electronic device.

The adhesive film according to the exemplary embodiment of the present invention include a protection film, a first adhesive layer formed on the protection film, a second adhesive layer formed on the first adhesive layer, and a release film formed on the second adhesive layer. The first adhesive layer and the second adhesive layer satisfy the following General Equation 1.

$$C > B > A \qquad \text{[General Equation 1]}$$

In the equation, A represents a peeling strength between the first adhesive layer and the protection film, B represents a peeling strength between the second adhesive layer and the release film, and C represents a peeling strength between the first adhesive layer and an encapsulation substrate after the protection film is removed.

In an exemplary embodiment, the first adhesive layer and the second adhesive layer may satisfy the following General Equation 2.

$$B - A \geq 5 \text{ gf/25 mm} \qquad \text{[General Equation 2]}$$

In addition, the first adhesive layer and the second adhesive layer may satisfy the following General Equation 3.

$$C - B \geq 16 \text{ gf/25 mm} \qquad \text{[General Equation 3]}$$

In the present disclosure, the term "organic electronic device" may refer to a product or a device having a structure including an organic material layer generating a charge flow between a pair of opposite electrodes using holes and electrons. For example, the organic electronic device may be a photovoltaic device, a rectifier, a transmitter, an organic light emitting diode (OLED), and the like, but is not limited thereto. According to an exemplary embodiment of the present invention, the organic electronic device may be an OLED.

In the present disclosure, the encapsulation substrate may be a glass or a polymer film, but is not limited thereto, and any one capable of encapsulating the adhesive film can be used without limitation.

Figure 1:
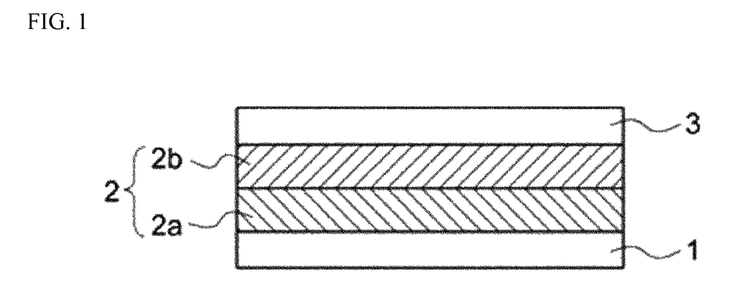
FIG. 1 is a cross-sectional view showing an adhesive film according to an exemplary embodiment of the present invention.

The adhesive film according to exemplary embodiments of the present invention may have a variety of structures as long as the adhesive film satisfies the aforementioned structure. For example, as shown in FIG. 1, the adhesive film includes a protection film layer 1, a curable adhesive layer 2, and a release film layer 3 on the curable adhesive layer 2 sequentially from the bottom to the top. The curable adhesive layer 2 has a two-layer structure including a first adhesive layer 2a and a second adhesive layer 2b, and the release film layer 3 is formed on the second adhesive layer 2b. As a method for the adhesive layer 2 to have a multilayered structure, any method used in the art for forming a multilayered adhesive layer may be used without limitation.

The protection film layer 1 is formed to protect the curable adhesive layer 2 during a storing and transfer process after the adhesive film is fabricated. The release film layer 3 is used as a base material in a process of preparing the curable adhesive layer 2, and then peeled off after applied to an adherend. That is, when the adhesive film according to the exemplary embodiments of the present invention is ultimately applied in a process of encapsulating an organic electronic device, the protection film layer 1 and the release film layer 3 will not be included in a final product for encapsulating the organic electronic device.

Accordingly, when the adhesive film is applied in a process of encapsulating an organic electronic device, a process of peeling the protection film layer 1 and a process of peeling the release film layer 3 may be required. In this case, the protection film layer 1 and the release film layer 3 are required to be peeled thoroughly, and it is necessary to reduce failures, such as lifting or chipping of portions of the adhesive film.

Figure 2:
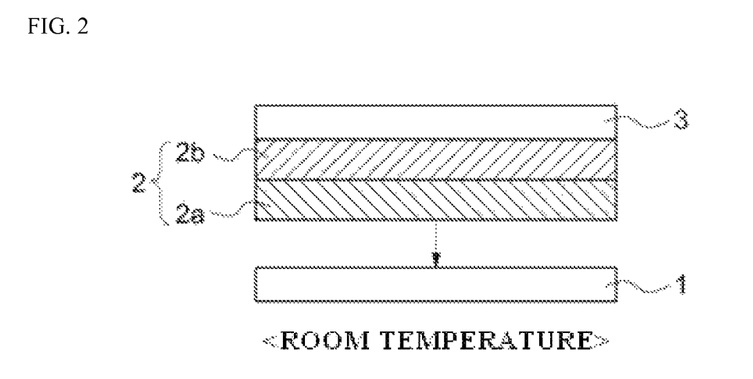
FIGS. 2 to 4 are cross-sectional views showing some processes of applying an adhesive film according to an exemplary embodiment of the present invention in a process of encapsulating an organic electronic device.
Figure 3:
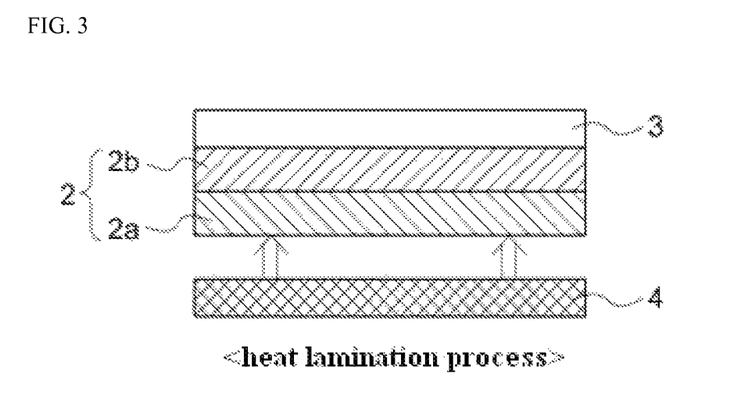
Figure 4:
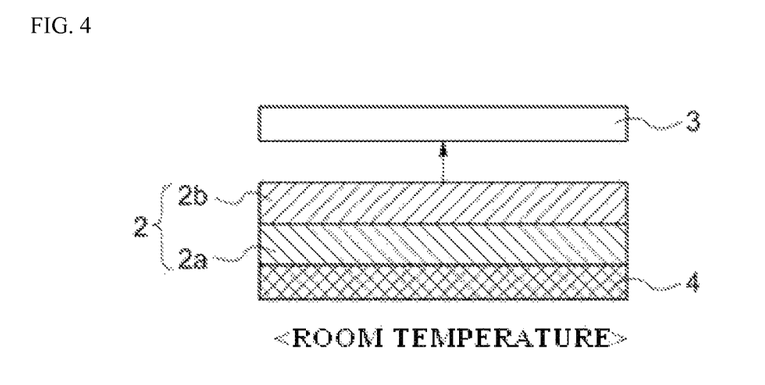

FIGS. 2 to 4 are cross-sectional views showing some processes of applying an adhesive film according to an exemplary embodiment of the present invention in a process of encapsulating an organic electronic device. The processes shown in FIGS. 2 to 4 may take place in sequence. First, as shown in FIG. 2, a protection film layer 1 is peeled off from the adhesive film at room temperature, in order to use the adhesive film according to the exemplary embodiment of the present invention to encapsulate the organic electronic device. Next, a first adhesive layer 2a exposed by peeling off the protection film layer 1 is attached to an encapsulation substrate 4. Then, adhesion between the encapsulation substrate 4 and the adhesive film is enhanced in a heat lamination process (e.g., a hot-roll lamination process). Finally, a release film layer 3 disposed on an opposite surface to a surface of the adhesive film to which the encapsulation substrate 4 is attached is peeled off and removed at room temperature to use the adhesive film for encapsulating the organic electronic device.

To remedy a poor peeling phenomenon in the adhesive film according to the exemplary embodiments of the present invention, a peeling strength A between the first adhesive layer 2a and the protection film layer 1 is smaller than a peeling strength B between the second adhesive layer 2b and the release film layer 3, as described in General Equation 1. Accordingly, during a peeling process in which the protection film layer 1 is removed as shown in FIG. 2, the adhesive layer 2 may be prevented from being lifted from an interface with the release film layer 3.

In addition, the adhesive film according to the exemplary embodiments of the present invention has the peeling strength B between the second adhesive layer 2b and the release film layer 3 smaller than a peeling strength C between the first adhesive layer 2a and the encapsulation substrate 4. Accordingly, as shown in FIG. 4, when the release film layer 3 is peeled off in the process of removing the release film layer 3 after attaching the first adhesive layer 2a exposed after the protection film layer 1 is peeled off, to the encapsulation substrate 4, and attaching the adhesive film to the encapsulation substrate by the heat lamination process as shown in FIG. 3, failures in which portions of the adhesive layer 2 are lifted or chipped off from the encapsulation substrate 4 may be prevented.

That is, in the adhesive film according to the exemplary embodiments of the present invention, the poor peeling phenomenon may be remedied by a two or more layered adhesive layer having different peeling strengths at both sides. In an exemplary embodiment, the difference B−A between the peeling strengths of the first adhesive layer 2a and the second adhesive layer 2b may be 5 gf/25 mm or more, preferably 5 gf/25 mm to 30 gf/25 mm, more preferably 6 gf/25 mm to 28 gf/25 mm, still more preferably 8 gf/25 mm to 25 gf/25 mm, far more preferably 10 gf/25 mm to 20 gf/25 mm, or most preferably 12 gf/25 mm to 18 gf/25 mm, as described in General Equation 2. Further, in another exemplary embodiment, a difference C−B between the adhesive strength between the first adhesive layer 2a and the encapsulation substrate 4 and the peeling strength between the second adhesive layer 2b and the release film layer 3 may be 16 gf/25 mm or more, 16 gf/25 mm to 60 gf/25 mm, 17 gf/25 mm to 50 gf/25 mm, 18 gf/25 mm to 45 gf/25 mm, or 20 gf/25 mm to 40 gf/25 mm. The peeling strength may be measured using a texture analyzer and an ASTM3330 measurement method.

A process of setting the peeling strengths of the adhesive film to increase in the order of A, B, and C as described above, may be carried out, for example, as follows.

First, the peeling strength A between the first adhesive layer 2a and the protection film layer 1 may become smaller than the peeling strength B between the second adhesive layer 2b and the release film layer 3 by setting compositions of the adhesive layers 2a and 2b to be different or adding a surface additive to each adhesive layer. As an example, as the method of setting compositions of the two adhesive layers 2a and 2b to be different, a content of liquid epoxy having flowability at room temperature in each adhesive layer may be controlled. In this case, the content of the liquid epoxy may be 5 to 70 wt % based on the whole of each adhesive layer.

In addition, the surface additive may be added to one of the first adhesive layer 2a and the second adhesive layer 2b, or added to both first adhesive layer 2a and second adhesive layer 2b in different contents. Otherwise, different types of surface additives relatively suitable for inherent surface properties of the release film and the protection film may be selectively used to the first adhesive layer 2a and the second adhesive layer 2b. Likewise, by adding of the surface additive or making the content to be different, wettability of each adhesive layer on the protection film, the release film, or the encapsulation substrate may be improved. As the surface additive, a vinyl based, an amino based, an epoxy based, or methacryloxy based silane coupling agents; polyester-modified acryl; polyurethane; or an acrylic resin, and the like may be used.

In this way, by adding of the surface additives or setting compositions of the adhesive layers 2a and 2b to be different, the peeling strength B between the second adhesive layer 2b and the release film layer 3 can be adjusted to be at least 5 gf/25 mm greater than the peeling strength A between the first adhesive layer 2a and the protection film layer 1.

In addition, a process of adjusting the peeling strength B between the second adhesive layer 2b and the release film layer 3 to be smaller than the peeling strength C between the first adhesive layer 2a and the encapsulation substrate 4 may be carried out, for example, as follows. Specifically, the peeling strength B between the second adhesive layer 2b and the release film layer 3 is smaller than the peeling strength C between the first adhesive layer 2a and the encapsulation substrate 4 at room temperature after the heat lamination process is carried out as shown in FIG. 3. Due to the heat lamination process such as a hot-roll lamination process, the adhesive film is attached to the encapsulation substrate 4, has flowability caused by heat, and has maximized adhesion and attachment to the encapsulation substrate 4. As an example, a content of a high molecular weight resin having a softening point of 40° C. or more in the first adhesive layer 2a may be adjusted to be 10 to 70 wt %, preferably 20 to 60 wt %, more preferably 25 to 50 wt %, and still more preferably 30 to 40 wt %, based on the entire layer.

Here, the heat lamination process by which the peeling strength C between the first adhesive layer 2a and the encapsulation substrate 4 increases may be carried out at a temperature of 40 to 80° C. The adhesive strength C between the first adhesive layer 2a and the encapsulation substrate 4 after the heat lamination process may be adjusted to be at least 16 gf/25 mm greater than the peeling strength B between the second adhesive layer 2b and the release film layer 3.

The viscosity of the adhesive film may be $10^6$ dyne/cm$^2$ or more, and preferably $10^7$ dyne/cm$^2$, at room temperature. The term "room temperature" refers to a natural temperature that is neither raised nor lowered, for example, a temperature of about 15 to 35° C., more specifically about 20 to 25° C., and more specifically about 25° C. The viscosity may be measured using an advanced rheometric expansion system (ARES). According to the exemplary embodiment of the present invention, since the viscosity of the adhesive layer is adjusted within the above-described range, the workability is excellent in the process of encapsulating an organic electronic device, and a flat panel may be encapsulated to have a uniform thickness. In addition, since problems, such as shrinkage or volatilized gas, generated by curing of resin are greatly reduced, physical or chemical damages applied to the organic electronic device may be prevented. According to the exemplary embodiment of the present invention, as long as the adhesive layer maintains a solid or semi-solid state at room temperature, an upper limit of the viscosity is not particularly limited, and may be, for example, controlled to be in the range of about $10^9$ dyne/cm$^2$ or less in consideration of workability, etc.

A water vapor transmission rate (WVTR) of the curable resin included in the adhesive layer in a cured state may be 50 g/m$^2$·day or less, preferably 30 g/m$^2$·day or less, more preferably 20 g/m$^2$·day or less, and still more preferably 15 g/m$^2$·day or less. The term "a cured state of curable resin" refers to a transition state, in which, when the curable resin is cured or crosslinked alone or through a reaction, etc., with another component such as a curing agent, to be applied as an encapsulant, the curable resin maintains ingredients, such as a moisture adsorbent and a filler, and performs as a structural adhesive. According to the exemplary embodiment of the present invention, after curing the curable resin and shaping the cured resin into a film having a thickness of 80 μm, the WVTR is measured in a thickness direction of the cured resin at 38° C. under 100% relative humidity. In addition, the WVTR is measured according to the ASTM F1249 standard.

By adjusting the WVTR within the above-described range, penetration by water, moisture, oxygen, and the like into an encapsulated organic electronic device product can be effectively prevented, and the moisture adsorbent can be effectively introduced.

According to the exemplary embodiment of the present invention, the encapsulated organic electronic device product shows superior performance when the WVTR of the cured state resin has a lower numerical value, and the lower limit is not particularly limited.

A specific type of the curable resin used in the exemplary embodiment of the present invention is not particularly limited. For example, various heat-curable or photo-curable resins that are well-known in the field may be used. The term "heat-curable resin" refers to a resin that is cured by proper application of heat or an aging process, and the term "photo-curable resin" refers to a resin that is cured by radiation of electromagnetic wave. In addition, the electromagnetic wave may include not only microwave, infrared (IR) rays, ultraviolet (UV) rays, X-rays, and γ-rays, but also particle beams, such as α-particle beams, proton beams, neutron beams, electron beams. According to the exemplary embodiment of the present invention, a cationic photo-curable resin may be an example of the photo-curable resin. The cationic photo-curable resin may refer to a resin which is curable by cationic polymerization or cationic curing induced by radiation of electromagnetic waves. Further, the curable resin may be a dual curable resin having both heat-curable and photo-curable properties.

A specific type of the curable resin used in the exemplary embodiment of the present invention is not particularly limited as long as the curable resin has the above-described properties. For example, the curable resin has adhesive properties when cured, and may be a resin containing at least one heat-curable functional group, such as a glycidyl group, an isocyanate group, a hydroxyl group, a carboxyl group or an amide group, or at least one functional group, which is cured by radiation of electromagnetic waves, such as an epoxide group, a cyclic ether group, a sulfide group, an acetal group, or a lactone group. In addition, as a specific type of the above-described resin, an acrylic resin, a polyester resin, an isocyanate resin, an epoxy resin, and the like may be used, but is not limited thereto.

According to an exemplary embodiment of the present invention, an aromatic or aliphatic epoxy resin, or a linear or branched epoxy resin may be used as the curable resin. In an exemplary embodiment, an epoxy resin including two or more functional groups and having an epoxy equivalent weight of 180 to 1,000 g/eq may be used. Characteristics of the cured resin, such as adhesive performance and glass transition temperature, may be effectively maintained by using the epoxy resin having the epoxy equivalent weight. As the an example of the epoxy resin, cresol novolak epoxy resin, bisphenol A type epoxy resin, bisphenol A type novolak epoxy resin, phenol novolak epoxy resin, 4-functional epoxy resin, biphenyl type epoxy resin, triphenol methane type epoxy resin, alkyl-modified-triphenol methane epoxy resin, naphthalene type epoxy resin, dicyclopentadiene type epoxy resin, dicyclopentadiene-modified-phenol type epoxy resin, or a mixture thereof may be used.

According to an exemplary embodiment of the present invention, an epoxy resin including a cyclic structure in a molecular structure may be preferably used, and an epoxy resin including an aromatic group (e.g., phenyl group) may be more preferably used. When the epoxy resin includes the aromatic group, the cured resin has excellent thermal and chemical stability and low moisture absorption. Accordingly, reliability of an encapsulation structure of an organic electronic device can be improved. As a specific example of the epoxy resin including an aromatic group used in the exemplary embodiment of the present invention, biphenyl type epoxy resin, dicyclopentadiene type epoxy resin, naphthalene type epoxy resin, dicyclopentadiene-modified-phenol type epoxy resin, cresol-based epoxy resin, bisphenol-based epoxy resin, xylok-based epoxy resin, a polyfunctional epoxy resin, phenol novolak epoxy resin, triphenol methane type epoxy resin, alkyl-modified triphenol methane epoxy resin, or a mixture thereof, but is not limited thereto.

More preferably as an example of the epoxy resin used in the exemplary embodiment of the present invention, silane-modified epoxy resin, still more preferably silane-modified epoxy resin having an aromatic group may be used. When the silane-modified epoxy resin structurally has a silane group, adhesion to a glass substrate or an inorganic material of a substrate of an organic electronic device may be maximized, and moisture barrier properties, durability, or reliability may be improved. A specific type of the epoxy resin used in the exemplary embodiment of the present invention is not particularly limited, and may be easily obtained from a supplier such as Kukdo Chemical Co., Ltd. etc.

The adhesive film may further include a moisture adsorbent and/or a filler. The moisture adsorbent and/or filler may be included in the first adhesive layer or the second adhesive layer, or both, and the content of the moisture adsorbent may be the same or different.

The term "moisture adsorbent" may collectively refer to a moisture reactive adsorbent which is a component capable of adsorbing or removing water or moisture externally introduced through a chemical reaction, etc.

The moisture adsorbent may chemically react with water, moisture, oxygen, and the like flowing into the adhesive layer to absorb water or moisture.

A specific type of the moisture adsorbent used in the exemplary embodiment of the present invention is not particularly limited, and the moisture adsorbent may be, for example, metal powders such as alumina, a metal oxide, a metal salt or phosphorus pentoxide (P2O5), or a mixture thereof. The physical adsorbent may be silica, zeolite, titania, zirconia, montmorillonite, or the like.

An example of a specific type of the metal oxide may be lithium oxide ($Li_2O$), sodium oxide ($Na_2O$), barium oxide (BaO), calcium oxide (CaO), magnesium oxide (MgO), or the like. An example of the metal salt may be a sulfate, such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$), and nickel sulfate ($NiSO_4$), a metal halide, such as calcium chloride ($CaCl_2$), magnesium chloride ($MgCl_2$), strontium chloride ($SrCl_2$), yttrium chloride ($YCl_3$), copper chloride ($CuCl_2$), cesium fluoride (CsF), tantalum fluoride ($TaF_5$), niobium fluoride ($NbF_5$), lithium bromide (LiBr), calcium bromide ($CaBr_2$), cesium bromide ($CeBr_3$), selenium bromide ($SeBr_4$), vanadium tribromide ($VBr_3$), magnesium bromide ($MgBr_2$), barium iodide ($BaI_2$), and magnesium iodide ($MgI_2$), or a metal chlorate, such as barium perchlorate ($Ba(ClO_4)_2$) and magnesium perchlorate ($Mg(ClO_4)_2$), but is not limited thereto.

According to an exemplary embodiment of the present invention, the moisture adsorbent such as the metal oxide may be properly processed and mixed into a composition. For example, depending on the type of the organic electronic device to which the adhesive film is applied, the adhesive layer may be a thin film having a thickness of 30 μm or less and, in this case, a process of milling the moisture adsorbent may be required. A three roll mill, a bead mill, or a ball mill may be used in the process of milling the moisture adsorbent. In addition, when the adhesive film according to the exemplary embodiment of the present invention is applied to a top emission type organic electronic device, etc., transmission through the adhesive layer is very important, and the size of the moisture adsorbent needs to be small. Accordingly, the milling process may be required for this use.

The filler may prevent penetration of water or moisture into an encapsulation structure by lengthening a path thereof, and maximize the water- and moisture-barrier property through a matrix structure of the curable resin and an interaction with the moisture adsorbent, etc. A specific type of the filler used in the exemplary embodiment of the present invention is not particularly limited and, for example, one selected from the group consisting of clay, talc, silica, zeolite, zirconia, titania, montmorillonite, or a mixture thereof may be used.

In addition, according to an exemplary embodiment of the present invention, in order to increase binding efficiency of the filler and an organic binder, a product surface-treated with an organic material may be used as the filler or a binding agent may be further added.

The curable adhesive layer according to an exemplary embodiment of the present invention may include one to 50 parts by weight, preferably one to 20 parts by weight of the filler with respect to 100 parts by weight of curable resin. By controlling a content of the filler to be one part by weight or more, a cured resin having excellent water- and moisture-barrier properties and mechanical properties may be provided. In addition, according to an exemplary embodiment of the present invention, by controlling the content of the filler to be 50 parts by weight or less, a film-type filler can be fabricated, and a cured resin having excellent water- and moisture-barrier properties may be provided even when the filler is formed as a thin-film.

The curable adhesive layer according to an exemplary embodiment of the present invention may further include a curing agent which reacts with the curable resin to form a matrix such as a crosslinked structure.

A specific type of the curing agent used in the exemplary embodiment of the present invention is not particularly limited and may be properly selected depending on the type of a curable resin to be used or the type of a functional group included in the curable resin. For example, when an epoxy resin is used as the curable resin in an exemplary embodiment of the present invention, a well-known curing agent for epoxy resin in the field may be used. More specifically, the curing agent for epoxy resin may be various amine-based compounds, imidazole-based compounds, phenol-based compounds, phosphorus-based compound, an acid anhydride-based compound, or a mixture thereof, but is not limited thereto.

The first and second curable adhesive layers may include, for example, one to 20 parts by weight, preferably one to 10 parts by weight of the curing agent with respect to a heat curable resin 100 parts by weight. However, the content is provided only for exemplary purposes of the present invention. That is, according to the exemplary embodiments of the present invention, the content of the curing agent may be changed depending on the type and content of a curable resin or functional group, a matrix structure to be implemented, or a cross-linking density, etc.

The curable adhesive layer according to an exemplary embodiment of the present invention may further include a high molecular weight resin. The high molecular weight resin may function to improve formability when a composition of the present invention is formed into the shape of a film or a sheet. In addition, the high molecular weight resin may function as a viscosity controlling agent controlling flowability during the heat lamination process. A softening point of the high molecular weight resin may be 40° C. or more, and the content of the high molecular weight resin may be adjusted to be 10 to 70 wt %, 20 to 60 wt %, 25 to 50 wt %, or 30 to 40 wt % based on the entire layer.

A specific type of the high molecular weight resin used in the exemplary embodiment of the present invention is not particularly limited, as long as it has compatibility with other components such as the curable resin. A specific type of the high molecular weight resin used in the exemplary embodiment of the present invention may be a resin having an weight average molecular weight of 20,000 or more, such as phenoxy resin, acrylate resin, a high molecular weight epoxy resin, a rubber having a high polar functional group, a reactive rubber having a high polar functional group, or a mixture thereof, but is not limited thereto.

When the high molecular weight resin is included in the curable adhesive layer, the content is adjusted depending on preferred properties, and is not particularly limited. For example, the high molecular weight resin according to the exemplary embodiment of the present invention may be included about 200 parts by weight or less, preferably 150 parts by weight or less, and more preferably about 100 parts by weight or less with respect to 100 parts by weight of the curable resin. According to the exemplary embodiment of the present invention, by adjusting the content of the high molecular weight resin to 200 parts by weight, the high molecular weight resin component may effectively maintain compatibility with other components, and serve as an adhesive.

The adhesive film according to the exemplary embodiment of the present invention may further include additives, such as a filler for improving durability of the cured resin, a binding agent for improving mechanical strength and adhesion, a plasticizer, a UV stabilizer, and an antioxidant in a range that does not affect the effectiveness of the present invention.

A specific kind of the protection film or the release film used in the exemplary embodiment of the present invention is not particularly limited. According to an exemplary embodiment of the present invention, a normal polymer film in the field, for example, may be used as the protection film or the release film. According to the exemplary embodiment of the present invention, a polyethylene terephthalate film, a polytetrafluoroethylene film, a polyethylene film, a polypropylene film, a polybutene film, a polybutadiene film, a vinyl chloride copolymer film, a polyurethane film, an ethylene-vinyl acetate film, an ethylene-propylene copolymer film, an ethylene-acrylate ethyl copolymer film, an ethylene-acrylate methyl copolymer film, a polyimide film, or the like may be used, for example, as the protection film or the release film. In addition, according to the exemplary embodiment of the present invention, a proper release treatment may be performed on one or both surfaces of the protection film or the release film. As an example of a release agent used for the release treatment of the protection film or the release film, an alkyd group, a silicone group, a fluorine group, an unsaturated polyester group, a polyolefin group, or a wax group may be used. Preferably, the alkyd group, the silicone group, and the fluorine group may be used in terms of thermal resistance, but the release agent is not limited thereto.

According to the exemplary embodiment of the present invention, a thickness of the protection film or the release film is not particularly limited, and is properly selected depending on its application. For example, according to the exemplary embodiment of the present invention, the thickness of the first film may be about 10 to 500 μm, or about 20 to 200 μm. When the thickness is less than 10 μm, deformation of a substrate film may occur, and when thickness is more than 500 μm, cost efficiency may be poor.

According to the exemplary embodiment of the present invention, the thickness of the adhesive layer included in the adhesive film is not particularly limited, and is properly selected depending on an application of the adhesive film.

A method of preparing the adhesive film according to the exemplary embodiment of the present invention is not particularly limited. For example, each adhesive layer of the adhesive film may be fabricated by a first process in which the protection film or the release film is coated with a coating solution including the aforementioned components of the adhesive layer, and a second process in which the coating solution coated in the first process is dried.

According to another exemplary embodiment of the present invention, an organic electronic device encapsulation product includes a substrate, an organic electronic element formed on the substrate, and a first adhesive layer and a second adhesive layer of the aforementioned adhesive film encapsulating the organic electronic element.

According to the exemplary embodiment of the present invention, the organic electronic device may be an OLED.

The organic electronic device encapsulation product may further include a protection layer disposed between the adhesive film and the organic electronic element and protecting the organic electronic element.

According to still another exemplary embodiment of the present invention, a method of encapsulating an organic electronic element may include peeling the protection film from the aforementioned adhesive film, attaching the first adhesive layer to the encapsulation substrate, peeling the release film, and laminating the second adhesive layer to be in contact with the organic electronic element. The attachment of the first adhesive layer to the encapsulation substrate may be performed in such a way that the peeling strength C between the first adhesive layer and the encapsulation substrate and the peeling strength between the second adhesive layer and the release film satisfy the following General Equation 3.

$$C-B \geq 16 \text{ gf}/25 \text{ mm} \quad \text{[General Equation 3]}$$

A process of applying the adhesive film to the organic electronic device may be performed using a hot-roll lamination process, a hot press process, or a vacuum press process, but is not particularly limited thereto.

The attachment of the first adhesive layer on the encapsulation substrate may include laminating the first adhesive layer to the encapsulation substrate at a temperature of 40 to 100° C., 60 to 80° C., or 70 to 90° C.

The attachment of the first adhesive layer on the encapsulation substrate may be performed in such a way that the difference C–B between the peeling strength C between the first adhesive layer and the encapsulation substrate, and the peeling strength B between the second adhesive layer and the release film is 16 gf/25 mm or more, 16 to 40 gf/25 mm, 16 to 35 gf/25 mm, 16 to 20 gf/25 mm, or 17 to 22 gf/25 mm.

The process of applying the adhesive film to the organic electronic element may be performed at a temperature of 50 to 90° C., and in such a way that the second adhesive layer covers the entire surface of the organic electronic element.

A process of curing the adhesive layer may be further included. The curing process may be performed by heating the adhesive layer at a temperature of 70 to 110° C. or radiating UV light.

The method of encapsulating the organic electronic element according to the exemplary embodiment of the present invention may include, for example, forming a transparent electrode on a substrate, such as glass or a polymer film, using a vacuum deposition or sputtering method, forming an organic material layer on the transparent electrode. The organic material layer may include a hole injection layer, a hole transport layer, a light emitting layer, an electron injection layer, and/or an electron transport layer. Next, a second electrode may be formed on the organic material layer. Next, the aforementioned adhesive film is applied on the organic electronic element of the substrate to cover the entire organic electronic element. Here, a method of applying the adhesive film to the organic electronic element is not particularly limited. For example, the encapsulation substrate (e.g., a glass or a polymer film) on which the adhesive layer of the adhesive film according to the exemplary embodiment of the present invention is pre-transferred may be applied on the organic electronic element formed on the substrate by a heating or pressing method. For example, when the adhesive film is transferred onto the encapsulation substrate, the aforementioned adhesive film according to the exemplary embodiment of the present invention may be transferred onto the encapsulation substrate using a vacuum press or a vacuum laminator after peeling the protection film or release film formed on the adhesive film. In this process, since adhesion or attachment of the adhesive film is reduced when a curing reaction of the adhesive film occurs excessively, the process temperature may be controlled to be about 100° C. or less, and a process time may be controlled to be 5 min. or less. Similarly, when the encapsulation substrate onto which the adhesive film is transferred is heat-pressed on the organic electronic device, the vacuum press or the vacuum laminator may be used. In this process, the temperature may be set as described above, and the process time may be 10 min. or less. The adhesive film is applied on the organic electronic element in such a way that the first adhesive layer rather than the second adhesive layer of the adhesive film is in contact with the organic electronic element (and in such a way that the first adhesive layer is in contact with the protection layer when the organic electronic device includes a protection layer).

In addition, according to the exemplary embodiment of the present invention, an additional curing process may be performed on the adhesive film pressed on the organic electronic device. The additional curing process (main curing process) may be performed, for example, in a heating chamber or a UV chamber. The condition of the main curing process may be properly selected in consideration of the stability of the organic electronic device.

However, the aforementioned preparation process is only an example of a process of encapsulating the organic electronic element according to the exemplary embodiment of the present invention, and the process sequence and conditions may be modified freely. For example, according to an exemplary embodiment of the present invention, the transfer and pressing process may be modified to be performed in the order in which the adhesive film according to the exemplary embodiment of the present invention is transferred onto the organic electronic element on the substrate, and then the encapsulation substrate is pressed. In addition, the protection layer is formed on the organic electronic element, then the adhesive film is applied, and then the adhesive film is cured with no encapsulation substrate.

Hereinafter, the present invention will be described in more detail through Examples according to the present invention and Comparative Examples not according to the present invention. However, the scope of the present invention will not be limited by the following Examples.

Example 1

1. Preparation of First Adhesive Layer Solution

As a moisture adsorbent solution, CaO (Sigma-Aldrich Co. LLC.) was added into methyl ethyl ketone at a concentration of 30 wt % to prepare a moisture adsorbent solution, and then the solution was milled for 24 hours in a ball mill process.

60 parts by weight of BPA-type liquid YD-128 (Kukdo Chemical Co. Ltd.) as an epoxy resin, 0.1 parts by weight of KBM-403 (Shin-Etsu Chemical Co. Ltd.) as a surface additive, and 40 parts by weight of YP-70 (Kukdo Chemical Co., Ltd.) as a high molecular weight resin having a softening point of 40° C. or more were added to prepare a homogenized solution. 6 parts by weight of 2PZ-CNS (Shikoku Chemicals Corp.) was added as a curing agent to the homogenized solution.

5 parts by weight with respect to the resin of the milling solution was added to the homogenized solution, and methyl ethyl ketone was added until the total solid content was about 50%, followed by high-speed stirring for one hour to prepare a first adhesive layer solution.

2. Preparation of Second Adhesive Layer Solution

Sixty parts by weight of BPA-type liquid YD-128 (Kukdo Chemical Co. Ltd.) as an epoxy resin, 0.1 parts by weight of KBM-403 (Shin-Etsu Chemical Co. Ltd.) as a surface additive, and 40 parts by weight of YP-70 (Kukdo Chemical Co. Ltd.) as a high molecular weight resin having a softening point of 40° C. or more were added to prepare a homogenized solution. Six parts by weight of 2PZ-CNS (Shikoku Chemicals Corp.) was added as a curing agent to the homogenized solution. Methyl ethyl ketone was added until the total solid content was about 50%, followed by high-speed stirring for one hour to prepare a second adhesive layer solution.

3. Preparation of Adhesive Film

The prepared second adhesive layer solution was coated on a release surface of a release polyethylene terephthalate (PET) using a comma coater and dried in a dryer at 130° C. for three minutes to form an adhesive layer having a thickness of 15 μm.

The prepared first adhesive layer solution was coated on a release surface of a release PET using a comma coater and dried in a dryer at 130° C. for three minutes to form an adhesive layer having a thickness of 30 μm.

A multilayered adhesive film was fabricated by laminating the first adhesive layer and the second adhesive layer.

4. Attachment of Encapsulation Substrate

A peeling strength A was measured after a protection film was removed, and an encapsulation substrate was formed by applying heat using a vacuum press, a vacuum laminator, etc.

Example 2

A multilayered adhesive film was prepared using the same method as described in Example 1, except that the weight ratios of the surface additives in the first adhesive layer and the second adhesive layer are different from those in the process of preparing the adhesive film of Example 1. That is, in Example 2, the content of the surface additive in the first adhesive layer increased to 0.2 parts by weight, and the content of the surface additive in the second adhesive layer increased to 0.5 parts by weight.

Example 3

A multilayered adhesive film was prepared using the same method as described in Example 1, except that the weight ratios of the epoxy resin in the first adhesive layer and the second adhesive layer are different from those in the process of preparing the adhesive film of Example 1. That is, in Example 3, the content ratio of a liquid epoxy and a high molecular weight resin in the first adhesive layer was changed to 65:35, and the content ratio of the liquid epoxy and the high molecular weight resin in the second adhesive layer was changed to 62:38.

Comparative Example 1

A multilayered adhesive film was prepared using the same method as described in Example 1, except that the content ratio of the liquid epoxy and the high molecular weight resin in the second adhesive layer was changed to 30:70 in the process of preparing the adhesive film.

Comparative Example 2

A multilayered adhesive film was prepared using the same method as described in Example 1, except that the content ratio of the liquid epoxy and the high molecular weight resin in the first adhesive layer was changed to 30:70 in the process of preparing the adhesive film.

Experimental Embodiment 1

Peeling Strength A: Since deformation values measured by an ASTM3330 measurement method are quite small, test samples were prepared to have a width of 4 inches, and then the measured values were divided by 4 and input as data. At constant temperature and humidity conditions, three first adhesive layers having a width of 4 inches are attached to glass using a roller, and then 180 degree peeling strengths were measured using a TA device.

Peeling Strength B: At constant temperature and humidity conditions in the ASTM3330 measurement method, three second adhesive layers having a width of 1 inch are attached to glass using a roller, and then 180 degree peeling strengths were measured using a TA device.

Peeling Strength C: At constant temperature and humidity conditions in the ASTM3330 measurement method, three first adhesive layers having widths of 1 inch are attached to glass by passing through a laminator heated to a temperature of 60° C., and then 180 degree peeling strengths as an adhesive strength between the adhesive layer and the glass were measured using a TA device.

TABLE 1

| Item | Example 1 | Example 2 | Example 3 | Comparative Example 1 | Comparative Example 2 |
| --- | --- | --- | --- | --- | --- |
| Peeling Strength A | 2.1 | 2.7 | 2.4 | 2.1 | 1.2 |
| Peeling Strength B | 13.6 | 15.2 | 16.9 | 7.0 | 13.6 |
| Peeling Strength C | 29.8 | 40.3 | 38.0 | 29.8 | 28.9 |
| Failure Rate When Protection Film Is Peeled Off | 0.2% | 0.1% | 0.1% | 25.8% | 0.1% |
| Failure Rate When Release Film Is Peeled Off | 0.4% | 0.1% | 0.2% | 0.1% | 1.5% |

The invention claimed is:

1. An adhesive film for encapsulating an organic electronic element, comprising:
   a protection film;
   a first adhesive layer formed on the protection film;
   a second adhesive layer formed on the first adhesive layer; and
   a release film formed on the second adhesive layer,
   wherein the first and second adhesive layers satisfy the following General Equation 1 and General Equation 2, $$C > B > A,\qquad \text{[General Equation 1]}$$

wherein A represents a peeling strength between the first adhesive layer and the protection film, B represents a peeling strength between the second adhesive layer and the release film, and C represents a peeling strength between the first adhesive layer and an encapsulation substrate after the protection film is removed, and $$B-A \geq 5gf/25 \text{ mm}. \quad \text{[General Equation 2]}$$

2. The adhesive film for encapsulating an organic electronic element of claim 1, wherein the first and second adhesive layers satisfy the following General Equation 3:

$$C-B \geq 16gf/25 \text{ mm}. \quad \text{[General Equation 3]}$$

3. The adhesive film for encapsulating an organic electronic element of claim 1, wherein at least one of the first and second adhesive layers comprises a moisture adsorbent and/or a filler component.

4. The adhesive film for encapsulating an organic electronic element of claim 1, wherein the first adhesive layer or the second adhesive layer comprises an acrylic resin, a polyester resin, an isocyanate resin, or an epoxy resin.

5. The adhesive film for encapsulating an organic electronic element of claim 4, wherein the first adhesive layer or the second adhesive layer further comprises a surface additive.

6. The adhesive film for encapsulating an organic electronic element of claim 5, wherein the surface additive is a vinyl based, an amino based, an epoxy based, or methacryloxy based silane coupling agents; polyester-modified acryl; polyurethane; or an acrylic resin.

7. The adhesive film for encapsulating an organic electronic element of claim 4, wherein the first adhesive layer further comprises a high molecular weight resin having a softening point of 40° C. or more.

8. The adhesive film for encapsulating an organic electronic element of claim 7, wherein the high molecular weight resin has a weight average molecular weight of 20,000 or more.

9. The adhesive film for encapsulating an organic electronic element of claim 8, wherein the high molecular weight resin is one or more selected from the group consisting of a phenoxy resin, an acrylate resin, an epoxy resin, a rubber having a polar functional group, and a reactive rubber having a polar functional group.

10. A method of encapsulating an organic electronic element, comprising:
peeling the protection film from the adhesive film of claim 1;
attaching the first adhesive layer to the encapsulating substrate;
peeling the release film; and
laminating the second adhesive film to be in contact with an organic electronic element.

11. The method of claim 10, wherein the attaching of the first adhesive layer to the encapsulating substrate is performed such that the peeling strength C between the first adhesive layer and the encapsulation substrate, and the peeling strength B between the second adhesive layer and the release film satisfy the following General Equation 3:

$$C-B \geq 16gf/25 \text{ mm}. \quad \text{[General Equation 3]}$$

12. The method of claim 10, wherein the attaching of the first adhesive layer to the encapsulating substrate comprises laminating the first adhesive layer to the encapsulating substrate at a temperature of 40° C. to 100° C.

13. The method of claim 12, wherein the laminating is performed such that the second adhesive layer covers the entire surface of the organic electronic element.

14. An organic electronic device, comprising:
a substrate;
an organic electronic element formed on the substrate; and
an adhesive film encapsulating the organic electronic element,
wherein the adhesive film comprises the first adhesive layer and the second adhesive layer of claim 1.

15. The organic electronic device of claim 14, wherein the second adhesive layer of the adhesive film covers the entire surface of the organic electronic element.

* * * * *